United States Patent [19]
Walker

[11] Patent Number: 6,046,943
[45] Date of Patent: Apr. 4, 2000

[54] SYNCHRONOUS SEMICONDUCTOR DEVICE OUTPUT CIRCUIT WITH REDUCED DATA SWITCHING

[75] Inventor: Darryl G. Walker, San Jose, Calif.

[73] Assignee: Texas Instuments Incorporated, Dallas, Tex.

[21] Appl. No.: 09/264,974

[22] Filed: Mar. 9, 1999

Related U.S. Application Data

[60] Provisional application No. 60/077,388, Mar. 10, 1998.

[51] Int. Cl.$^7$ .................................................. G11C 16/04
[52] U.S. Cl. ............................... 365/189.05; 365/189.07
[58] Field of Search .................. 365/189.05, 189.02, 365/189.07, 189.01

[56] References Cited

U.S. PATENT DOCUMENTS

| | | | |
|---|---|---|---|
| 5,216,637 | 6/1993 | Vaillancourt | 365/230.03 |
| 5,566,386 | 10/1996 | Kumakura et al. | 365/226 |
| 5,740,112 | 4/1998 | Tanaka et al. | 365/189.01 |
| 5,798,969 | 8/1998 | Yoo et al. | 365/189.05 |
| 5,835,449 | 11/1998 | Lee | 365/238.5 |
| 5,917,764 | 6/1999 | Ohsawa et al. | 365/200 |
| 5,920,208 | 7/1999 | Park | 327/54 |

OTHER PUBLICATIONS

Nakamura et al., "A 500–MHz 4–Mb CMOS Pipeline–Burst Cache SRAM with Point–to–Point Noise Reduction Coding I/O", *IEEE Journal of Solid–State Circuits*, pp. 1758–1765, Nov. 1997.

Stan et al., "Bus–Invert Coding for Low–Power I/O", *IEEE Transactions on Very Large Scale Integration (VLSI) Systems*, pp. 49–58, vol. 3, No. 1, Mar. 1995.

*Primary Examiner*—David Nelms
*Assistant Examiner*—Tuan T. Nguyen
*Attorney, Agent, or Firm*—Robby T. Holland; Carlton H. Hoel; Richard L. Donaldson

[57] ABSTRACT

A data output system (100) is disclosed. The data output system (100) includes a number of data output paths (102a–102h) which provide data output signals (DQ0–DQ7) to a data bus. An invert data path 104 provides an invert data signal (INVOUT) that indicates when the data output signals (DQ0–DQ7) have been inverted to reduce the number of transitions on the data bus. A voter circuit (106) determines when data output signal inversion occurs, and includes a local data comparator (132a–132h) associated with each data output path (102a–102h). Each data comparator (132a–132h) compares a current data output signal (D0–D7) with a next data output signal (DN0–DN7), and in response thereto, generates a differential on a pair of data compare lines (138 and 140). The differential on the data compare lines (138 and 140) is amplified by a differential amplifier (136) to generate the invert output signal (INVN) for the following data output cycle.

22 Claims, 7 Drawing Sheets

SYNCHRONOUS SEMICONDUCTOR DEVICE OUTPUT CIRCUIT WITH REDUCED DATA SWITCHING

This application claims benefit of U.S. Provisional Ser. No. 60/077,388 filed Mar. 10, 1998.

TECHNICAL FIELD

The present invention relates generally to semiconductor devices, and more particularly to output circuits that provide output data for semiconductor devices.

BACKGROUND OF THE INVENTION

As the speed of data processing devices has increased, a common bottleneck to electronic systems performance is the rate at which data can be transferred (bandwidth) between memory device and a data processing devices. For example, a microprocessor will read data from and write data to a memory device. In the event the memory device cannot provide data at a fast enough rate, the microprocessor will not able to operate at its maximum speed as it may undergo "wait" cycles as it waits for data. Such wait cycles can be of particular concern in high speed systems, such as synchronous systems.

The data bandwidth between two semiconductor devices (chip-to-chip bandwidth) can be increased by increasing the data word width (the number of data bits in parallel that are transferred between the two devices) and/or increasing the data output frequency (the speed at which the data bits are transmitted). Increasing the data word width has the effect of increasing the amount of current drawn by a device, as the number of outputs that must be switched between high and low logic levels increases. Increasing the data output frequency also results in increased current consumption, as the outputs are switched more often. Drawing increased current is undesirable, as the power supply to a semiconductor device may not be capable of handling such an increased current load.

Increased current draw also translates into increased power consumption. Low power consumption in a semiconductor device is an important feature, particularly for portable (battery powered) electronic systems.

Both methods of increasing chip-to-chip bandwidth (wider word widths and increased data output frequency) have the effect of increasing noise on the power supply lines. Such increased noise can affect chip functionality. In particular, input buffers which receive input data and various control signals can be susceptible to such noise, which can adversely affect data values and device control.

The power consumption caused by chip-to-chip communication is further exacerbated by the capacitance of the communication bus that connects the chips together. The relative distance between two chips is typically much greater than the distance between two communicating circuits in a semiconductor device. In addition, the bus lines that make up a communication bus are typically much thicker than the metal lines within a semiconductor device. These factors result in chip-to-chip communication buses having a relatively high capacitance. As a result, the output circuits of a semiconductor device must be capable of sinking and sourcing large amounts of current in order to drive the bus lines between logic values. This requirement results in most output circuits consuming more power than the other circuits within a semiconductor device.

One approach to reducing the noise involved in the switching of output circuits involves comparing the bits first received data value with a subsequently received second data value. If half or less than half, of the first value data bits need to be switched in order to generate the second data value, the second data value is allowed to be driven on the communication bus. However, if more than half of the first value data bits must be switched to generate the second data value, the second data value is first inverted, and then allowed to be driven on the communication bus. This arrangement has the effect of minimizing the amount of switching on the data bus, so that at most, one-half the data bits will need to be switched. This is in contrast to conventional output circuits which may need to switch all the data bits when changing from a first data value to a second data value. It is noted however, that such compare arrangements require an extra communication bus line in order to indicate if the data bus is being driven with an actual data value (i.e., half or less of the data bits needed to be switched) or an inverted value (i.e., more than half of the data bits needed to be switched). The process of reducing the number of transitions necessary to generate subsequent data values is often referred to as "low weight" coding.

"Bus-Invert Coding for Low-Power I/O" appearing in *IEEE Transactions on Very Large Scale Integration (VLSI) Systems,* pages 48–59 and dated March, 1995, by Stan et al., and incorporated by reference herein, proposes a data compare arrangement as described above. As best illustrated in FIG. 8, Stan et. al. samples an external bus, compares the sampled data with data that is to be written on the bus, and inverts or does not invert the data accordingly. One problem with this approach is that the time required to sample the external bus can take too long, making the output circuits inappropriate for high speed systems. In addition, in the arrangement of Stan et al., the external bus could be in a "grey" zone (undeterminable logic) voltage level, which could cause the sampling input buffers to consume excess power and perhaps oscillate ("thrash"), which could cause the majority voter to malfunction.

"A 50% Noise Reduction Interface Using Low-Weight Coding", appearing in 1996 *Symposium on VLSI Circuits Digest of Technical Papers,* pages 144–145, by Nakamura et al., incorporated by reference herein, discloses another such coding arrangement Nakamura et al., however, can suffer from the same drawbacks of Stan et al. Furthermore, Nakamura et al. teaches the transmission of a low weight code from a transmitting circuit to a receiving circuit, and provides no teachings on taking into consideration a previous inversion value when determining whether or not to invert the next data value. As a result, the approach of Nakamura et al. may cause more than half of the data bits to be switched on the external bus, in the case where exactly half the bits don't match, and the previous data word had been inverted. This case will be explained in more detail in the description of the preferred embodiment that follows below.

"A 500-MHz 4-Mb CMOS Pipeline-Burst Cache SRAM with Point-to-Point Noise Reduction Coding I/O", appearing in *IEEE Journal of Solid-State Circuits,* dated November 1997, by Nakamura et. al., incorporated by reference herein, discloses another coding scheme. It is noted that Nakamura et. al. does not disclose any power saving mechanisms for the output buffer or the majority voter circuit. In addition, Nakamura et al. may not provide the speed performance necessary for very high speed memory devices.

Accordingly, it would be desirable to provide an output circuit that decreases the number of times output driver is required to switch the logic level on a chip-to-chip communication bus. It would also be desirable to provide such an output circuit with large chip-to-chip data bandwidth capability, low power consumption and low power supply noise characteristics.

SUMMARY OF THE INVENTION

According to the preferred embodiment, a data output system includes a number of data output paths that provide data output signals for use on a data bus. Along with the data output paths is an invert data output path which provides an invert output signal that indicates whether data output signals represent true logic values, or represent inverted logic values. Inversion of data signals is implemented to reduce the amount of switching required to drive the data bus. The preferred embodiment further includes a voter circuit, which determines when inversion of data signals is required. The voter circuit includes a data comparator associated with each data output path. Each data comparator compares a current data output signal with an expected (or "next") data output signal. The results of the comparison operation are used to drive a pair of compare lines commonly coupled to the data comparators. The voltage differential created on the compare lines by the data comparators is amplified by a differential amplifier to generate the invert output signal for the following data output cycle. The use of the local data comparators (i.e., data comparators located in proximity to each data output path) in conjunction with the compare lines reduces the amount of area required for the data output system.

According to one aspect of the preferred embodiment, the differential amplifier and data output paths are enabled and disabled by an output enable signal.

According to another aspect of the preferred embodiment, the data output paths each include a data latch circuit for latching the currently output data signal for comparison with a next data output signal.

An advantage of the preferred embodiment is that it provides an output circuit that generates a reduced number of transitions on an output bus, with the output circuit further consuming low amounts of current.

Yet another advantage of the preferred embodiment is that it provides an output circuit that generates a reduced number of transitions on an output bus, with the output circuit further providing high-speed performance.

Yet another advantage of the preferred embodiment is that it provides an output circuit that generates a reduced number of transitions on an output bus, with the output circuit further having reduced signal routing, and therefore contributing to reduction in size of such a semiconductor device.

DETAILED DESCRIPTION OF THE EMBODIMENTS

The preferred embodiment is a data output system that may be used in a synchronous integrated circuit device for driving an external data bus. The preferred embodiment output system compares the bits of a first data value, that is being output on a current clock cycle, with the data bits of a second data value, that is to be output on a subsequent clock cycle. According to the result of the comparison, on the subsequent clock cycle, the external data bus is driven with the second data value, or alternately, the inverse of the second data value, in order to reduce the number of logic transitions that occur on the external data bus.

The preferred embodiment has the advantages of reduced layout area, reduced current consumption and improved speed. In addition, it is to be understood that while preferred embodiment will be discussed with respect to a data output system for driving a highly capacitive external bus, the teachings of the preferred embodiment may be applied to other applications. As just two such examples, the output data system could be coupled to a data bus interface between two circuit blocks within the same integrated circuit device. In addition, the output circuit could be coupled to a bus interface between two die in a wafer scale integration scheme, or between two die in a multi-chip module.

Figure 1:
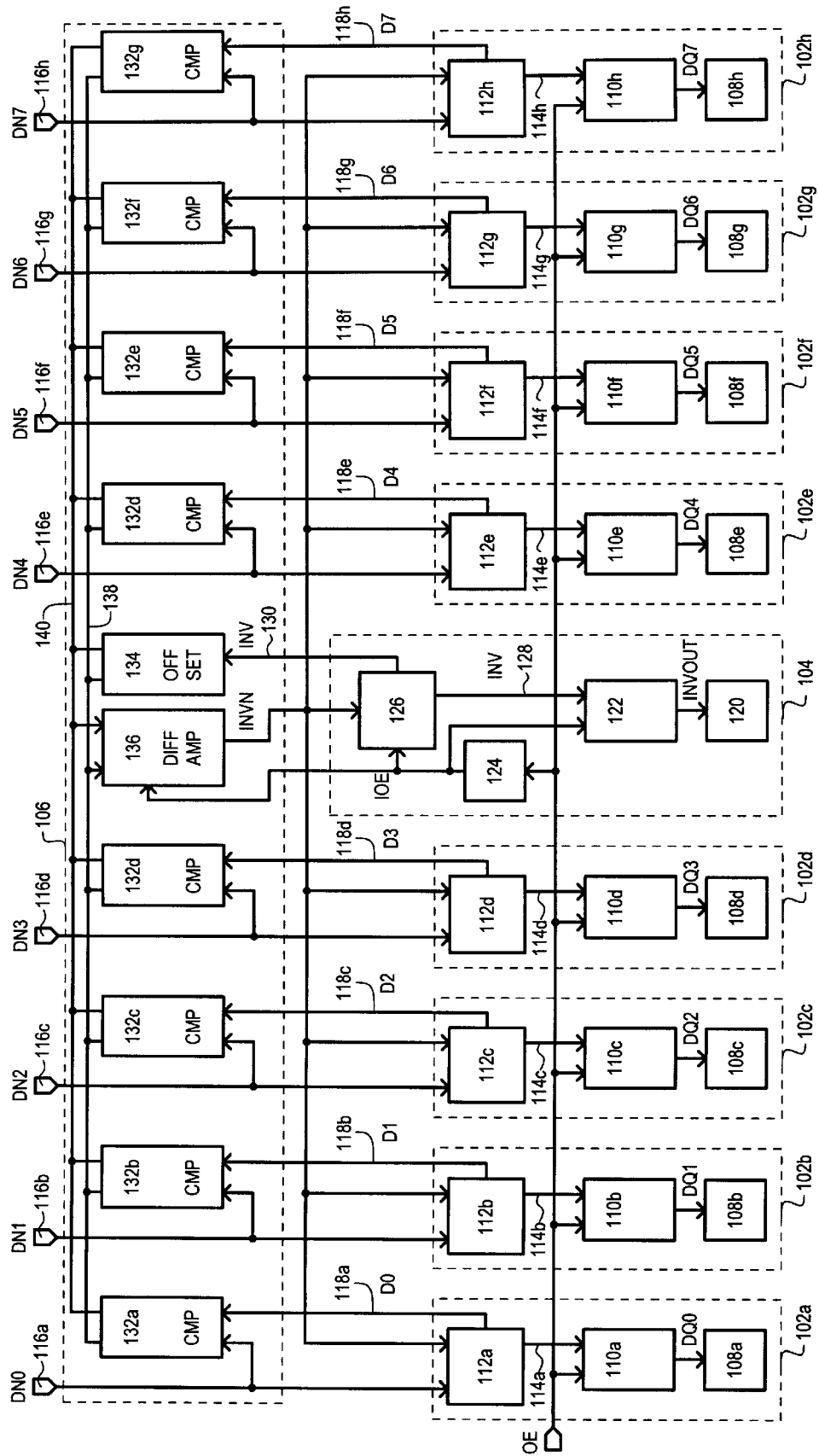
FIG. 1 is a block schematic diagram illustrating a preferred embodiment.

The novel synchronous data output system is set forth in a floor plan block diagram in FIG. 1. The data output system is designated by the general reference character 100, and is shown to include eight data output paths, shown as 102a–102h, an invert data output path 104, and a voter circuit 106. The preferred embodiment has a "by eight" (×8) configuration, in that it provides eight data outputs to form an eight-bit word. The bits of the word are shown as DQ0–DQ7. In the preferred embodiment, the data output paths 102a–102h each include the same general functional blocks. Accordingly, like functional blocks are designated with the same reference numeral, but end with a letter corresponding to a particular data output bit. For example, those circuit constituents corresponding to data bit DQ0, end with the letter "a," and those constituents corresponding to data DQ1 ends with the letter "b."

FIG. 1 is referred to as a "floor" block diagram, because the various systems portions are placed in the general physical location as they would appear on an integrated circuit device. Of course, the blocks may be placed in differing orders, but those items ending with a letter ("a" to "h") would be located in the same general physical location of other items ending with the same letter. While FIG. 1 represents a general physical arrangement of the various portions making up the preferred embodiment 100, it is understood the various items set forth in the illustration are not drawn to scale, nor represent the relative distance that various portions are placed with respect to one another.

In the preferred embodiment, the output paths 102a–102h each operate in the same general fashion. To that extent, only data path 102a will be discussed in detail, it being understood that the remaining data paths 102b–102h operate in the same fashion. Data path 102a is shown to include a data bond pad 108a, an output driver 110a, and a data latch circuit 112a The bond pad 108a is driven with the data value DQ0 by the output driver 110a.

The bond pad 108a is connected to an external data bus through a package holding the integrated circuit device. For example, the bond pad 108a may be connected to a package lead frame by a bond wire. The package lead frame provides an external package pin that is connected to the external data bus, enabling the integrated circuit device to communicate with other devices coupled to the external data bus. The bond pad 108a typically consists of an area, formed from a top most metal layer of the integrated circuit, that is large enough to allow the bond wire to make a reliable contact.

The output driver 110a receives a logic signal from the data latch circuit 112a by way of an internal output line 114a. The output driver 110a (along with the other output drivers 110b–110h) is enabled by an output enable signal OE. When the OE signal is active, the output driver 110a drives its respective data bond pad 108a according to the logic value on the data output line 114a.

The data latch circuit 112a receives a next data output signal DN0 from a next input data node 116a. The next data input nodes (116a–116h) receive data from additional internal circuitry (not shown) of the integrated circuit device. In addition to providing the logic value on the data output line 114a, the data latch 112a also provides a latched data value D0 on a data latch output 118a. As shown in FIG. 1, the remaining data latches (112b–112h) each provides its own latched data value D1–D7 at a data latch output (118b–118h). The latched data values D0–D7 can also be considered intermediate output data as they will need to be driven by the output drivers (110a–110h) to generate output signals. Alternately, the data values D0–D7 can be considered to be internal data values, as they are internal to the data output system 100.

As mentioned earlier, the other seven data output paths 102b–102h are composed of identical functional blocks, and so operate in the same manner as the DQ0 data output path 102a.

The invert data output path 104 of the preferred embodiment 100 is shown to include an invert data bond pad 120, an invert data output driver 122, a programmable option 124, and an invert data latch circuit 126. As in the case of the data bond pads (108a–108h), the invert data bond pad 120 is connectable to an invert data bus via a bond wire, lead frame, and package pin. The invert data output driver 122 receives an invert logic value from the invert data latch circuit 126 by way of an internal invert line 128. The invert data output driver 122 further receives an invert output enable signal IOE, provided by the programmable option 124. When the IOE signal is at a low logic level, the invert data output driver 122 is disabled, and placed in a high impedance state. When the IOE signal is at a high logic level, the invert data output driver 122 is enabled, and will drive the invert data bond pad 120 in accordance with the logic on the internal invert line 128, to generate an invert output signal INVOUT.

The invert data latch circuit 126 receives a "next" invert data signal INVN, the IOE signal, and in response thereto, provides an invert data output signal INV on an invert data latch output 130. The INV signal is further provided as an input to each of the data latch circuits 112a–112h. The invert data latch circuit 126 is enabled when the IOE signal is high, and disabled when the IOE signal is low. In the preferred embodiment 100, the invert data latch circuit 126 also receives a system clock signal (not shown) to allow it to operate in synchronism with a system.

In the preferred embodiment 100, the programmable option 124 drives the IOE signal in response to the logic of the OE signal, but can be programmed by a manufacturing step to force the IOE signal low at all times. In this manner, the programmable option 124 allows the invert data output path 104 to be disabled with a manufacturing step. When the invert data output path 104 is disabled, the data output system 100 can operate as a conventional data output system (i.e., one that will not invert data values). The programmable arrangement of the preferred embodiment 100 provides greater flexibility, in that the same data output system can be used in different devices, with one particular option being selected in a later manufacturing step.

Referring once again to FIG. 1, the voter circuit 106 of the preferred embodiment 100 includes eight data comparators, shown as 132a–132h, a majority offset circuit 134, and a differential amplifier 136. The voter circuit 106 further includes a first data compare line 138 and second data compare line 140. The voter circuit 140 is shown to receive the next data signals DN0–DN7, the data latch outputs (118a–118h), the invert data latch output 130, and the IOE signal. In response to these various inputs, the voter circuit 106 outputs the "next" invert signal INVN.

As mentioned earlier, FIG. 1 represents a floor plan block diagram. In the preferred embodiment arrangement 100, the portions of the output data system that are associated with a given bond pad are all located in the same general physical location. For example, data bond pad 108a, data output driver 110a, data output latch circuit 112a and data comparator 132a, are all located in relative close proximity to one another on the integrated circuit. In another example, all the various circuits of the data output path 102g (which correspond to DQ6) are physically located near data comparator 132g. The physical groupings of the circuitry (i.e., the "layout") allow a more efficient signal routing scheme. In the prior art, all of the data signals going to a voter circuit require relatively large amounts of signal routing channel space. In contrast, in the preferred embodiment 100, the signal routing channel space is occupied only by the first and second data compare lines (138 and 140). The resulting data output system saves chip layout area, and provides for a smaller overall integrated circuit device size. Because multiple integrated circuit devices are fabricated at the same time on a single semiconductor wafer, smaller device sizes will translate into more devices per wafer, thus reducing manufacturing costs.

Figure 2:
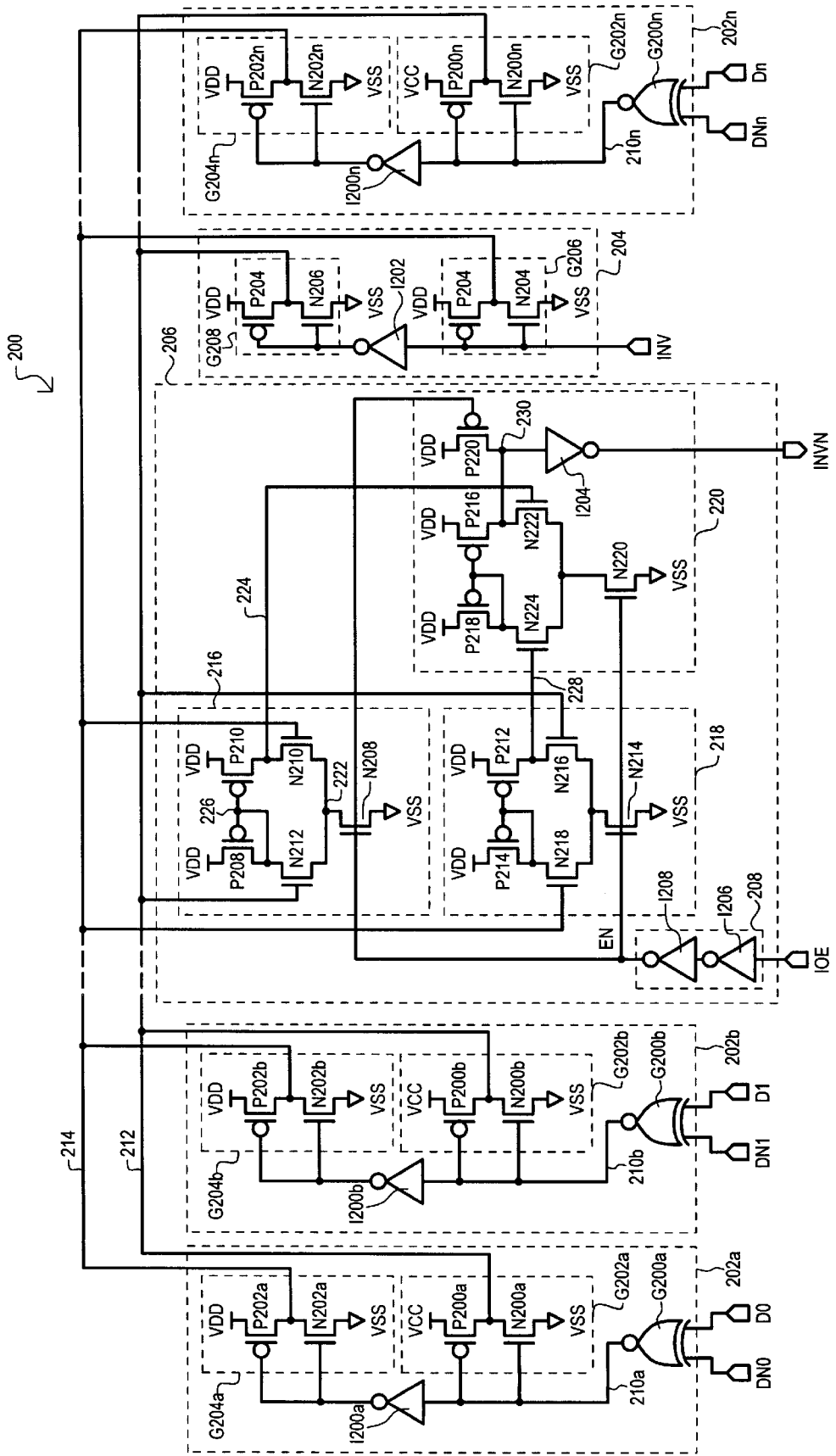
FIG. 2 is a schematic diagram of a voter circuit of the preferred embodiment.

Referring now to FIG. 2, a voter circuit is set forth in a schematic diagram. The voter circuit is given the general reference character 200 and may be used as the voter circuit shown as item 106 in FIG. 1. The voter circuit 200 includes "n" data comparator circuits 202a–202n, a majority offset circuit 204, a differential amplifier 206, and a voter enable buffer 208. The voter circuit 200 receives eight latched data values (D0–Dn), eight next data values (DN0–DNn), an invert data output signal INV, and an invert output enable signal IOE. In response to the various signals, the voter circuit provides a next invert data signal INVN.

In the preferred embodiment voter circuit 200, the eight data comparator circuits 202a–202h (only three of which are shown in FIG. 2) are identical, and operate in the same manner. Therefore, only the operation of data comparator circuit 202a will be discussed. Data comparator circuit 202a is shown to include a data compare gate G200a, an inverter 1200a, compare application gate G202a, and a complementary compare application gate G204a. The compare gate G200a receives the latched data value D0 and the next data value DN0 and generates therefrom a compare output 210a. In the preferred embodiment 200, the compare gate G200a is an exclusive NOR (XNOR) logic gate, and so will produce a high logic output when the latched data value D0 is the same as the next data value DN0. Conversely, compare gate G200a will produces a low logic output when the latched data value D0 and next data value DN0 are different. The compare output 210a is applied directly to the compare application gate G202a, and to the complementary compare application gate G204a by way of inverter I200a.

The compare application gate G202a includes a p-channel metal(conductor)-oxide(insulator)-semiconductor (PMOS) transistor P200a, and an n-channel MOS (NMOS) transistor N200a. Transistor P200a has its source-drain coupled between a high power supply VDD and a first data compare line 212, while its control gate is coupled to the compare output 210a. NMOS transistor N200a has its source-drain coupled between a low power supply VSS and the first data compare line 212, while its control gate is also coupled to the compare output 210a. When there is a match between the latched data value D0 and the next data value DN0, the high logic level of the compare output 210a is applied to the gates of NMOS transistor N200a and PMOS transistor P200a. NMOS transistor N200a is placed in a conducting state, and PMOS transistor P200a will be placed in a non-conducting state. This has the affect of pulling the first compare line 212 to a lower potential. Conversely, a "no match" condition at the compare gate G200a results in the PMOS transistor P200a being in a conductive state, and the NMOS transistor N200a being a non-conductive state. This drives a first compare line 212 to a higher potential.

The compare output 210a also drives the complementary compare application gate G204a, by way of inverter I200a. The complementary compare application gate G204a has the same general arrangement as compare application gate G202a, including a PMOS transistor P202a and NMOS transistor N202a. The complementary compare application gate G204a provides a response on a second compare line 214 that is complementary to the first compare line 212. Thus, in the event there is a match between the latched data value D0 and the new data value DN0, the second compare line 214 will be driven to a higher potential by PMOS transistor P202a being placed in the conductive state. NMOS transistor N202a will be in a non-conducting state. It follows that when there is a no match between the D0 and DN0 values, the second compare line will be driven to a lower potential.

As mentioned earlier, all eight data comparator circuits 202a–202n operate in the same fashion. The data comparator circuits 202a–202n each receive a latched data value (D0–Dn) and a corresponding next data value (DN0–DNn), and depending upon whether there is match condition or no match condition, will couple the first data compare line 212 to the low power supply VSS and the second data compare line 214 to the high power supply voltage VDD, or vice versa.

In addition to being driven by the data comparator circuits 202a–202n, the first and second compare lines (212 and 214) are further driven by the majority offset circuit 204. In the preferred embodiment, the majority offset circuit 204 includes an offset application gate G206, a complementary offset application gate G208, and an inverter I202. The offset application gate G206 includes a PMOS transistor P204 having a source-drain path coupled between the high power supply VDD and the second compare line 214, and its control gate coupled to the invert data output signal INV. In addition, the offset application gate G206 further includes an NMOS transistor N204 with its source-drain path coupled between the low power supply VSS and the second compare line 214, and its control gate also coupled to the invert data output signal INV.

The complementary offset application gate G208 has the same arrangement as the offset application gate G206, including a PMOS transistor P206 and an NMOS transistor. The gates of the PMOS and NMOS transistors (P206 and N206) are coupled to the output of inverter I202, while the drains of the transistors are coupled to the first compare line 212. Accordingly, the complementary offset application gate G208 provides a complementary response on the first compare data line 212 to that provided by the offset application gate G206 on the second compare data line 214.

Thus, in the preferred embodiment majority offset circuit 204, when the invert data output signal INV is low, PMOS transistor P204 within the offset application gate G206 will be in the conducting state, pulling the second compare line 214 to a higher potential. NMOS transistor N204 will be in a non-conducting state. At the same time, inverter I202 will invert the INV signal and apply it to the complementary offset application gate G208. In response, NMOS transistor N206 will be in the conducting state, pulling the first compare line 212 to a lower potential. In this manner, when the invert data output signal INV is low, the majority offset circuit 204 has the effect of pulling the first compare line 212 incrementally closer to the VSS potential and pulling the second compare line 214 incrementally closer to the VDD potential.

It follows from the above description, that when the invert data output signal INV is high, the second compare line 214 will be driven to a lower potential by the offset application gate G206, and the first compare line 212 will be driven to a higher potential by the complementary offset application gate G208. Thus, when a high invert data output signal INV is applied, the majority offset circuit has the effect of pulling the first compare line 212 incrementally closer to the VDD potential and pulling the second compare line 214 incrementally closer to the VSS potential.

It is noted that in the preferred embodiment majority voter circuit 200, transistors P206, N206, P208, N208, P202a–P202n, and N202a–N202n have relatively small channel width/length ratios, and thus have relatively high "on" (i.e., when the transistor is in the conducting state) resistance values. It is further noted that transistors P206, N206, P208, N208, P202a–P202n, and N202a–N202n all have the same channel width/length ratios. This arrangement gives each data comparator circuit (202a–202n) and the majority offset circuit 204 equal "voting" strength in incrementally driving the first and second compare lines (212 and 214) between the VDD and VSS voltages.

In the preferred embodiment voter circuit 200, the differential amplifier 206 drives the next invert data signal INVN according to the differential potential between the first and second compare lines (212 and 214) (i.e., drives the compare lines according to the result of the voting by the data comparator circuits and majority offset circuit). The differential amplifier 206 includes a primary amplifier 216, a complementary amplifier 218, and a secondary amplifier 220.

The primary amplifier 216 includes an enabling NMOS transistor N208 having its source-drain path coupled between the low power supply voltage VSS and a bias node 222. The control gate of NMOS transistor N208 receives the enable signal EN. A first sense NMOS transistor N210 has its source-drain path coupled between the bias node 222 and a primary amplifier output 224. The control gate of NMOS transistor N210 is coupled to the second compare line 214. A second sense NMOS transistor N212 has its source-drain path coupled between the bias node 222 and a load bias node 226. Two load PMOS transistors, P208 and P210, are coupled in series with the NMOS transistors N212 and N210, respectively. PMOS load transistor P208 has its source-drain path coupled between the high power supply voltage VDD and the load bias node 226, and PMOS load transistor P210 has its source-drain path coupled between the high power supply VDD and the primary amplifier output 224.

The primary amplifier 216 is a differential amplifier. When the enable signal EN is high, the primary amplifier 216 is active, and will drive the primary amplifier output 224 according to the voltage differential between the first and second compare lines (212 and 214). For example, when the first compare line 212 is at an incrementally higher potential then the second compare line 214 (which corresponds to an invert next data condition as will be explained) NMOS transistor N212 will be turned on more than NMOS transistor N210, causing the load bias node 226 to be pulled lower. As the potential of the load bias node 226 falls, load transistor P210 will be turned on harder, pulling the primary amplifier output 224 to a higher potential, thereby generating a logic high. Conversely, when the first compare line 212 is at an incrementally lower potential than the second compare line 214 (which corresponds to "do not invert next data" condition as will be also be explained) NMOS transistor N210 will be turned on more than NMOS transistor N212, causing the load bias node 226 to remain at a higher potential. PMOS load transistor P210 will thus operate in a more resistive region that PMOS transistor P208, allowing the primary amplifier output 224 to be pulled to a lower potential, producing a logic low output at the primary amplifier output 224.

The complementary amplifier 218 receives the first data compare line 214, the second data compare line 216, and the enable signal EN, and drives a complementary amplifier output 228 in response thereto. The complementary amplifier 218 has the same general configuration as the primary amplifier 216, including an NMOS enabling transistor N214, first and second NMOS sense transistors, N216 and N218, and two PMOS load transistors P212 and P214. The complementary amplifier 218 thus operates in the same manner as the primary amplifier 216 with the exception being that the inputs to the complementary amplifier (first and second data compare lines 214 and 216) have been switched. This switching of the input nodes has the effect of making the complementary amplifier output 228 the logical complement of the primary amplifier output 224.

Referring still to FIG. 2, the secondary amplifier 220 of the differential amplifier 206 is shown to receive both the primary amplifier output 224 and the complementary amplifier output 228. The secondary amplifier 220 is shown to include an enabling NMOS transistor N220, first and second NMOS sense transistors N222 and N224, and two PMOS load transistors P216 and P218 arranged in the same fashion as the primary amplifier 216 and complementary amplifier 218. The secondary amplifier 220 further includes a PMOS precharge transistor P220 and an output inverter I204. The PMOS precharge transistor P220 has its source-drain path coupled between the high power supply voltage VDD and a secondary amplifier output 230. The control gate of PMOS transistor P220 receives the enable signal EN. The output inverter I204 receives the secondary amplifier output 230 and produces the next invert signal INVN in response thereto.

As discussed above, when the first data compare line 212 has a potential that is incrementally higher than the second data compare line 214 (an invert data condition), the primary amplifier output 224 will be at a logic high and the complementary amplifier output 228 will be at a logic low. This causes NMOS sense transistor N222 to be turned on more than NMOS transistor N224. A logic low level at the secondary amplifier output 230 results, which is then inverted by output inverter I204 to produce a logic high next invert data signal INVN. Conversely, when the first data compare line 212 has a potential that is incrementally lower than the second data compare line 214 (a do not invert data condition), the primary amplifier output 224 will be at a logic low and the complementary amplifier output 228 will be at logic high. A logic high level will be generated at the secondary amplifier output 230, which will then be inverted by output inverter I204, to produce a low next invert data signal INVN.

Thus, the secondary amplifier 220 serves to amplify the difference between the primary amplifier output 224 and the complementary amplifier output 228, and in doing so, enables the differential amplifier 206 to "sense" a very small voltage difference between the first and second compare lines (212 and 214). In the preferred embodiment, voltages in the range of ten millivolts may be reliably sensed.

The voter enable buffer 208 receives the invert output enable signal IOE, and buffers it to generate the enable signal EN for the differential amplifier 206. In the preferred embodiment, the voter enable buffer includes two buffer inverters I206 and I208 arranged in series. Inverter I206 receives the invert output enable signal IOE at its input, and has its output coupled to the input of inverter I208. Inverter I208 provides the enable signal EN at its output.

In the preferred embodiment, when the enable signal EN is high, the voter circuit 200 is enabled. However, when the enable signal EN is low, the voter circuit 200 is disabled as the enabling transistors N208, N214 and N220 will be turned off, preventing current from being drawn in the primary, complementary and secondary amplifiers (216, 218 and 220). As shown in FIG. 2, the EN signal is also applied to the gate of PMOS precharge transistor P220. This allows the secondary amplifier output 230 to be driven to a high, and hence the next invert data signal INVN be driven to a low, when the voter circuit 200 is disabled.

It is noted that it may be desirable to include a number of "power" transistors to the voter circuit 200 of FIG. 2 to reduce the amount of current drawn when the voter circuit 200 is disabled. A power transistor could be arranged in series between a power supply voltage and each of the compare application gates G202a–G202n, complementary compare application gates G204a–G204n, the offset application gate G206, and the complementary offset application gate G208. The power transistors should have an on resistance that is much less than any of the other transistors in the application gates (G202a–G202n, G204a–G204n, G206 and G208). The power transistors could be coupled to the enable signal EN so that the power transistors are turned on when the enable signal EN is at a logic high level, and turned off when the enable signal EN is at a logic low level. Such an arrangement could further reduce the "stand-by" power consumption of the voter circuit 200 by reducing the amount of current drawn by the application gates (G202a–G202n, G204a–G204n, G206 and G208) when the voter circuit 200 is disabled.

Figure 3:
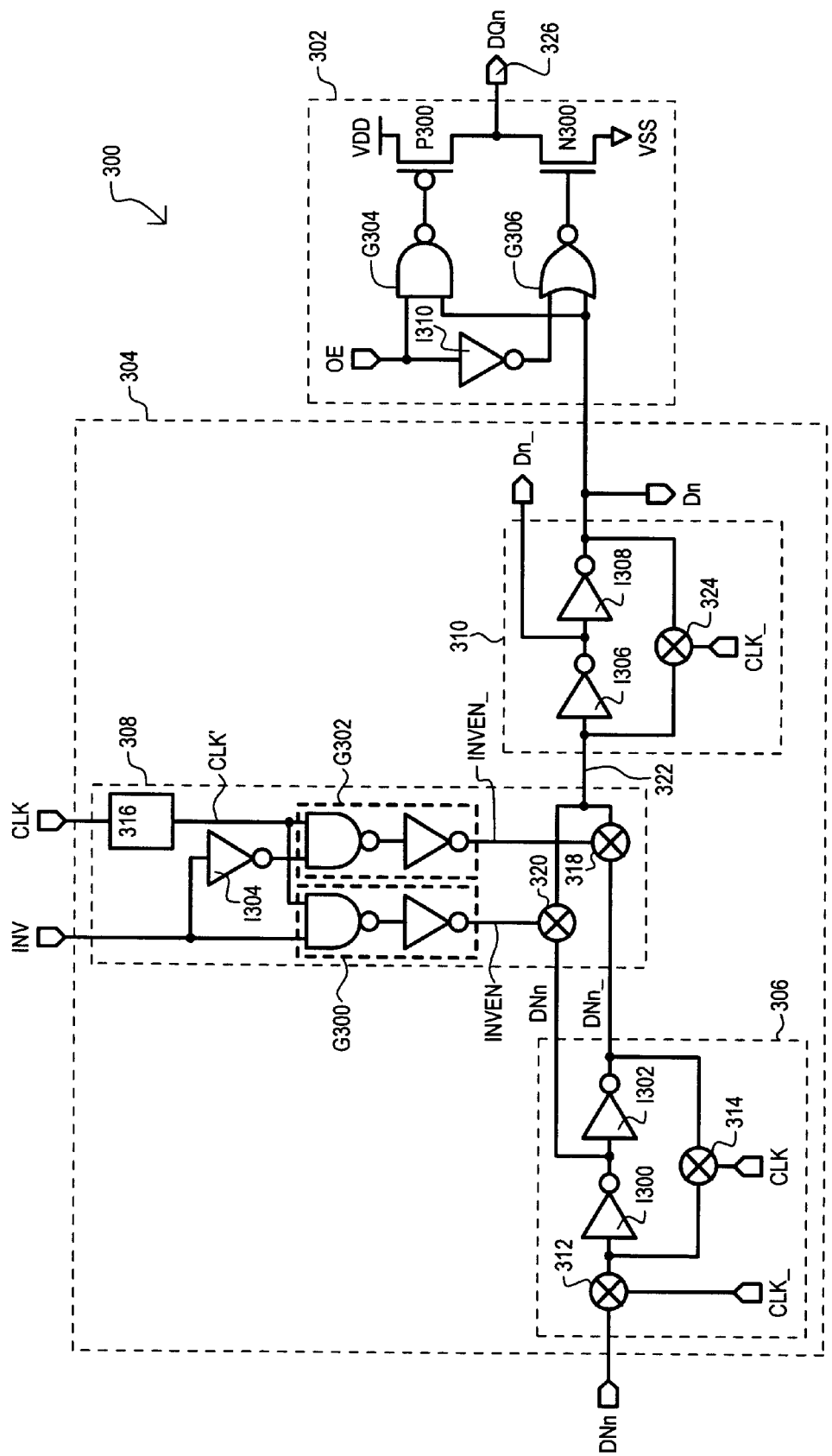
FIG. 3 is a schematic diagram illustrating a data output path of the preferred embodiment.

Referring now to FIG. 3, a schematic diagram is set forth illustrating a data output path according to the preferred embodiment. The data output path set forth in FIG. 3 may be used as any of the data output paths shown as items 102a–102h in FIG. 1. The data output path is designated by the general reference character 300 and is shown to include an output driver 302 (which can be considered to correspond to one of the output drivers 110a–110h FIG. 1) and a data latch circuit 304 (which can be considered to correspond to one of the data latch circuits 112a–112h in FIG. 1).

The data latch circuit 304 can be conceptualized as having three sections, a next data latch 306, an invert control 308 and an output latch 310. The next data latch 306 latches a next data value DNn, thereby providing the next data value DNn and its complement DNn_ to the invert control 308. The invert control 308 receives the invert data output signal INV, and in response thereto, couples either the next data value DNn or its complement DNn_ to the output latch 310. The output latch 310 latches the value received from the invert control 308 to generate a latched data value Dn to the output driver 302. In the preferred embodiment, the data latch circuit 304 operates in synchronism with a system clock signal, therefore, the next data latch 306, invert control 308 and output latch 310 each receive a clock signal CLK and/or its inverse CLK_.

The next data latch 306 of the preferred embodiment output path 300 is shown in FIG. 3 to include an input transfer gate 312, a first inverter I300, a second inverter I302 in a series arrangement. When enabled, the input transfer gate 312 transfers the next data value DNn to the first inverter I300. The first inverter generates the complementary value DNn_, and provides it to the invert control 308 and the second inverter I302. The DNn_ value is inverted once again by the second inverter provide a buffered DNn' value to the invert control. The input transfer gate 312 is enabled when the clock signal is low, and so is shown receiving the inverse clock signal CLK_. The output of the second inverter I302 is coupled to the input of the first inverter I300 (thereby forming a latch) by a first latching transfer gate 314. In this arrangement, when the clock signal is low, the input transfer gate 312 is on, and the first and second inverters (I300 and I302) drive their outputs according to the next data value DNn. When the clock signal goes high, the input transfer gate 312 is turned off, isolating the first and second inverters (I300 and I302), and the first latching transfer gate 314 is turned on, latching the next data value DNn.

The invert control 308 of the preferred embodiment data output path 300 includes a first control gate G300 and a second control gate G302. The control gates (G300 and G302) receive the invert data output signal INV and the clock signal CLK, and in response thereto, activate either an invert enable signal INVEN or a complementary no invert signal INVEN_. In the preferred embodiment, the first and second control gates (G300 and G302) each include a two-input NAND gate in series with an inverter. The NAND gate of the first control gate G300 receives the INV signal as one input, and a delayed clock signal CLK' as a second input. The NAND gate of the second control gate G302 receives the inverse of the INV signal as one input, and a delayed clock signal CLK' as a second input. The inverse of the INV signal is generated by passing the INV signal through a third inverter I304. The delayed clock signal CLK' is generated by passing the CLK signal through a rising edge delay unit 316. A rising edge delay signal CLK' is used by the control gates (G300 and G302) to enable the INV signal to propagate to the control gates before the active (rising) edge of the CLK signal.

The invert control 308 selects the buffered next data value DNn' or its complement DNn_ by the operation of no invert transfer gate 318, that is enabled by the INVEN_ signal, and an invert transfer gate 320, that is enabled by the INVEN signal. Thus, when the INV signal and CLK signal are both high, the INVEN signal is high, and the invert transfer gate 320 is turned on, transferring the complementary next data value DNn_ to a select output 322. At the same time, the INVEN_ signal is low, and the no invert transfer gate 322 is turned off, preventing the buffered next data value DNn' from being transferred to the select output 322. Conversely, when the CLK signal is high and the INV signal is low, the no invert transfer gate 318 is turned on, and the buffered next data value DNn' is transferred to the select output 322. The invert transfer gate 320 is turned off. Of course, when the CLK signal is low, both the invert and no invert transfer gates (318 and 320) are turned off. In this manner, the data latch circuit 304 acts as a switching circuit to provide data values, or inverse data values according to the INV signal.

The output latch 310 of the preferred embodiment data output path 300 is shown to include a fourth inverter I306 and a fifth inverter I308 arranged in series. The input of the fourth inverter I306 is coupled to select output 322. The output of the fourth inverter I306 provides a complementary latched data value Dn_. The output of the fifth inverter I308 provides the latched data value Dn to the output driver 302. The output latch 310 further includes a second latching transfer gate 324 which, when enabled by the CLK_ signal, couples the Dn value to the input of the fourth inverter I306, thereby forming a latch.

The output driver 302 of the preferred embodiment data output path 300 is shown in FIG. 3 to include a first drive gate G304, a second drive gate G306, a first drive device P300 and a second drive device N300. The first and second drive gates (G304 and G306) each receive the latched data value Dn from the data latch circuit, and the output enable signal OE, and in response thereto, activate either the first drive device P300 or the second drive device N300. In the preferred embodiment the first drive gate G304 is a two-input NAND gate having one input that receives the Dn value, and a second input which receives the OE signal. The second drive gate is a two-input NOR gate, having one input that receives the Dn value and a second input which receives the complement of the OE signal, generated by a sixth inverter I310. The preferred embodiment first drive device P300 is a PMOS transistor having a source-drain path coupled between the high power supply voltage VDD and a driver output node 326. The gate of PMOS transistor P300 is coupled to the output of the first driver gate G304. The second drive device N300 is an NMOS transistor having a source-drain path coupled between driver output 326 and the low power supply voltage VSS. The gate of NMOS transistor N300 is coupled to the output of the second drive gate G306. In this arrangement, when the OE signal is high, and the Dn value is low, the output of the first drive gate G304 is high and the output of the second drive gate G306 is high. The first drive device P300 is turned off and the second drive device N300 is turned on, pulling the driver output 326 low. Conversely, when the OE signal is high and the Dn value is high, the second drive device N300 is turned off, and the first drive device P300 is turned on, pulling the driver output 326 high. When the OE signal is low, the first and second drive devices (P300 and N300) are both turned off, regardless of the Dn value.

Figure 4:
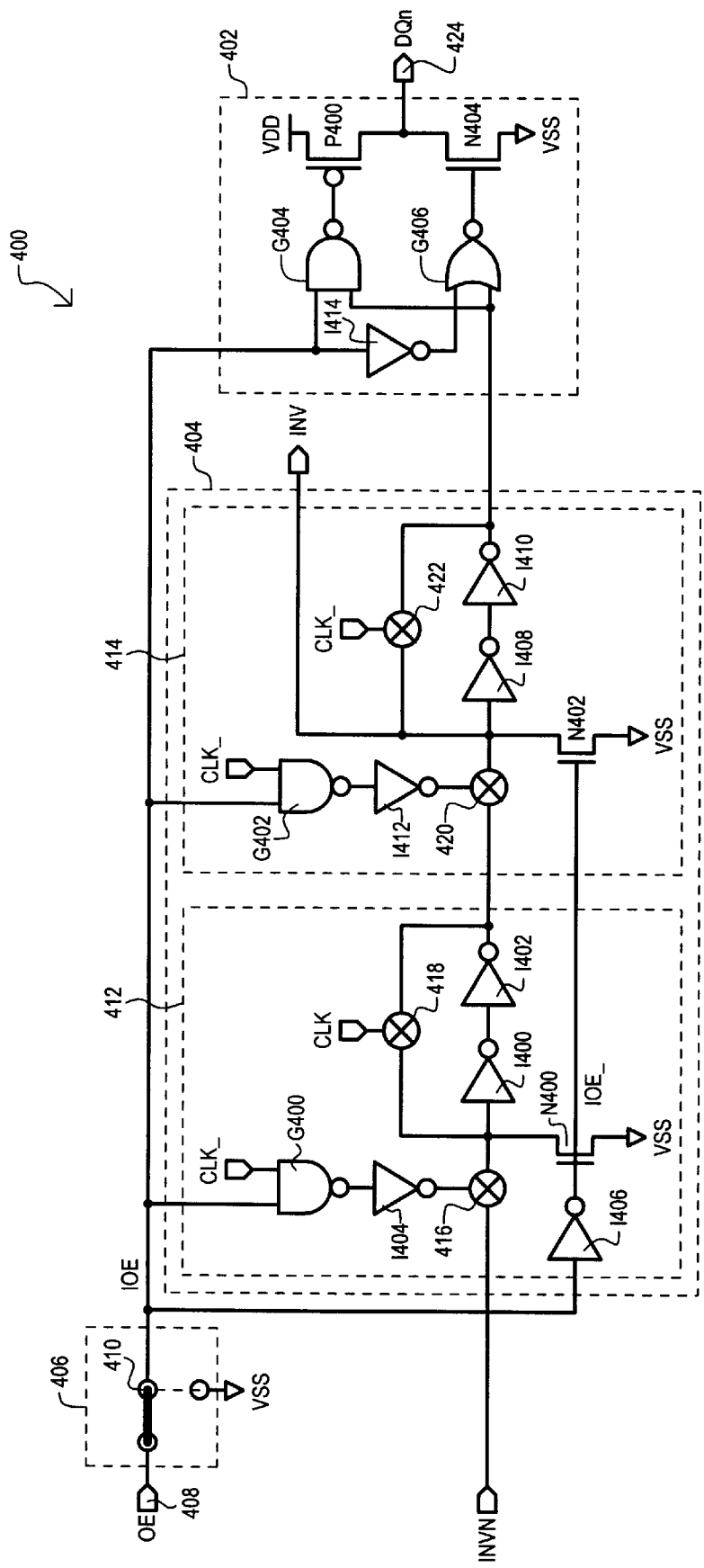
FIG. 4 is a schematic diagram illustrating an invert data output path of the preferred embodiment.

Referring now to FIG. 4, a schematic diagram is set forth illustrating an invert data output path according to the preferred embodiment. The invert data output path may be used as the invert data output path shown as item 104 in FIG. 1. The invert data output path is designated by the general reference character 400 and is shown to include an invert data output driver 402 (which can be considered to correspond to the invert data output driver 122 in FIG. 1), an invert data latch circuit 404 (which can be considered to correspond to the invert data latch circuit 126 in FIG. 1), and a programmable option 406 (which can be considered to correspond to the programmable option 124 in FIG. 1).

The preferred embodiment programmable option 406 is shown to include a signal input 408 (which receives the output enable signal OE) and an option output 410. The programmable option 406 provides alternate connections, the first which will couple the signal input 408 to the option output 410, thereby providing an invert output enable signal IOE that generally follows the OE signal. The second connection couples the option output 410 to the low power supply voltage VSS, thereby forcing the IOE signal to a low (disabled) state. The option output 410 provides the IOE signal to both the invert data output driver 402 and the invert data latch circuit 404. In this manner, the invert data output driver 402 and the invert data latch circuit 404 can be placed in an enabled state (signal input 408 coupled to option output 410) or a disabled state (option output 410 coupled to VSS) by the configuration of the programmable option 406.

The invert data latch circuit 404 can be conceptualized as having a next invert data latch 412 and an invert data output latch 414. The next invert data latch 412 latches a next invert data value INVN, thereby providing the next invert data value INVN to the invert data output latch 414. The invert data output latch 414 latches the value received from the next invert data latch 412 to generate the invert data output signal INV. In the preferred embodiment, the invert data latch circuit 404 operates in synchronism with the system clock signal CLK, therefore, the next invert data latch 412 and invert data output latch 414 each receive the clock signal CLK and/or its inverse CLK__.

The next invert data latch 412 is shown in FIG. 4 to include a first input transfer gate 416, a first inverter I400, and a second inverter I402, all arranged in series. When enabled, the first input transfer gate 416 transfers the next invert data value INVN to the first inverter I400. The first inverter I400 and second inverter I402 provide a buffered INVN' value to the invert data output latch 414. The first input transfer gate 416 is enabled by the series arrangement of a two-input NAND gate G400 and a third inverter I404. Gate G400 receives the inverse clock signal CLK__ as one input, and the IOE signal as a second input. Thus, when both the CLK__ signal and IOE signal are high, the first input transfer gate 416 is turned on. The output of the second inverter I402 is coupled to the input of the first inverter I400 (thereby forming a latch) by a first latching transfer gate 418, which is enabled by the CLK signal. In this arrangement, when the clock signal is low and the IOE signal is high, the first input transfer gate 416 is on, and the first and second inverters (I400 and I402) drive their outputs according to the next invert data value INVN. When the clock signal goes high, the first input transfer gate 416 is turned off, isolating the first and second inverters (I400 and I402) from the INVN value, and the first latching transfer gate 418 is turned on, latching the next invert data value INVN.

The next invert data latch 412 further includes a first disable device N400 that is coupled to the input of the first inverter I400 and controlled by the IOE signal. When the IOE signal is high, the first disable device N400 is off, and does not affect the logic of the nodes within the next invert data latch 412. However, when the IOE signal is low, the first disable device N400 is turned on, forcing the value latched by the next invert 412 to a predetermined logic value. In the preferred embodiment, the first disable device is an NMOS transistor having a source-drain path coupled between the input of the first inverter I400 and the low power supply voltage VSS. The gate of NMOS transistors N400 receives the complement of the IOE signal (IOE__) as generated by a fourth inverter I406.

The invert data output latch 414 has the same general arrangement as the next invert data latch 412, and includes a second input transfer gate 420 in series with a fifth inverter I408 and a sixth inverter I410. The second input transfer gate 420 is controlled by a two-input NAND gate G402 in series with a seventh inverter I412. One input of gate G402 receives the IOE signal, the other input receives the CLK signal. Thus, when the CLK signal and IOE signal are both high, the second input transfer gate 420 is turned on. The invert data output latch 414 also includes a second latching transfer gate 422 enabled by the CLK__ signal, and a second disable device N402. Accordingly, when the clock signal is high and the IOE signal is high, the second input transfer gate 420 is on, and the fifth and sixth inverters (I408 and I410) drive their outputs according to the buffered invert data value INVN' provided by the next invert data latch 412. When the clock signal goes low, the second input transfer gate 420 is turned off, and the second latching transfer gate 422 is turned on, latching the buffered next invert data value INVN to provide the invert data output value INV. The invert data output latch 414 is disabled by the second disable device N402 in the same way the next invert data latch 412 is disabled by the first disable device N400.

The invert data output driver 402 of the preferred embodiment has the same configuration as the output driver 302 in FIG. 3, including a first drive gate G404, a second drive gate G406, a first drive device P400, a second drive device N404, and an eighth inverter I414. Like the output driver 302 of FIG. 3 drives the driver output 326 according to the latched data value Dn and the output enable signal OE, the invert data output driver 402 drives the INVOUT signal at an invert driver output 424 according to the invert data output INV (provided by the invert data latch circuit 404) and the IOE signal.

Figure 5:
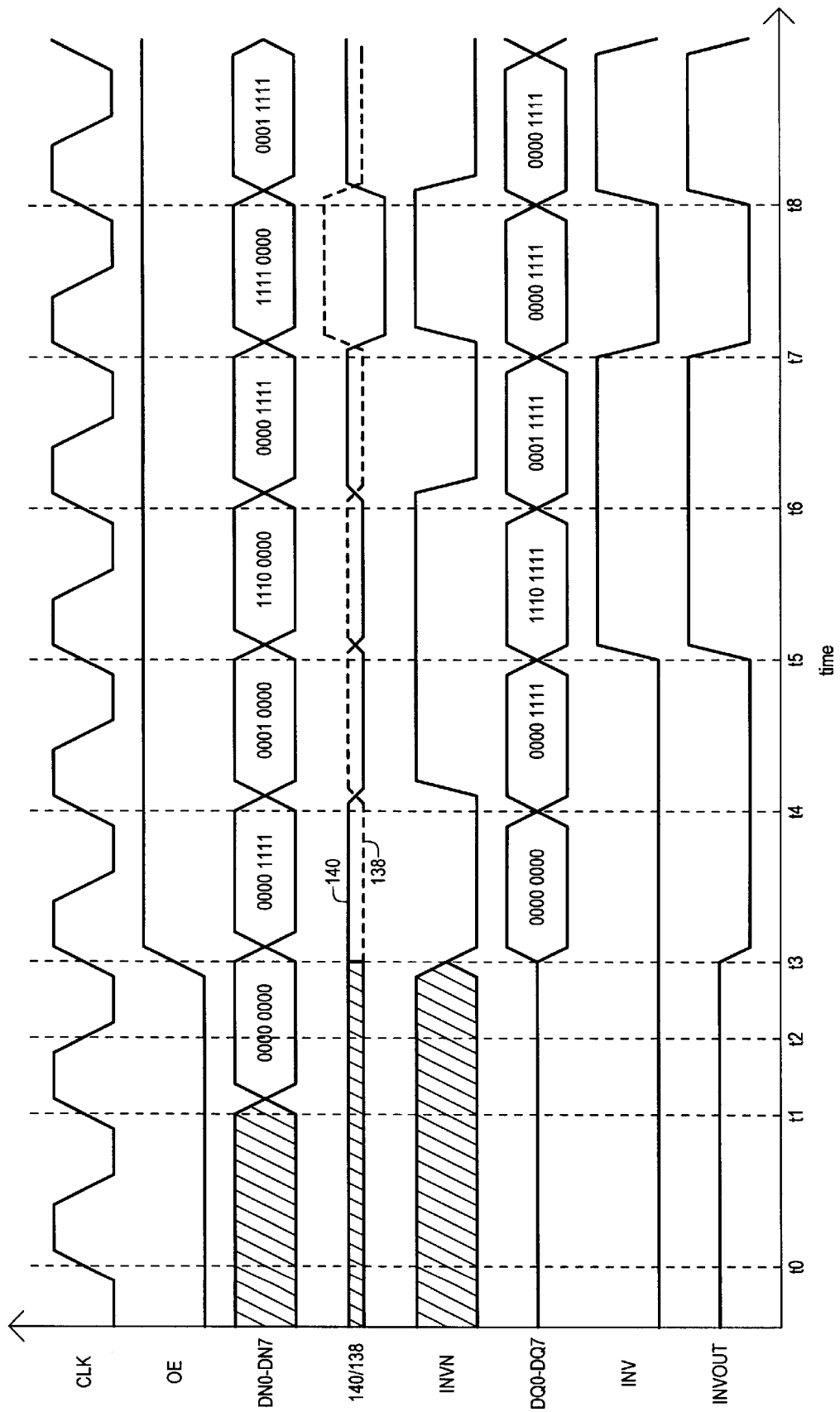
FIG. 5 is a timing diagram illustrating the operation of the preferred embodiment.

Referring now to FIG. 5, a timing diagram is set forth illustrating the operation of the preferred embodiment data output system 100. The timing diagram illustrates the various timing signals and circuit responses resulting from the output of seven data values. Set forth in FIG. 5 is the CLK signal, the output enable signal OE, the latched data values D0–D7, the response of the first data compare line 138 (shown as a dashed waveform), the response of the second data compare line 140 (shown as a solid waveform), the INVN signal, the resulting output data DQ0–DQ7, the INV signal, and the INVOUT signal.

At time t0 a read cycle is activated on the rising edge of the CLK cycles. The OE signal is low, resulting in the output drivers (110a–110h), invert data output driver 122, invert data latch circuit 126, and the differential amplifier 136 all being disabled. As a result, the D0–D7 values are shown in a "don't care" state. The data comparators (132a–132h) may also be disabled by the low OE signal turning of "power" transistors, as described above, causing the data compare lines (138 and 140) to be driven only by the majority offset circuit 134. With the OE signal low, the disabled differential amplifier 136 produces a low INVN signal (and hence a low INV signal). The low INV signal input into the majority offset circuit 134 causes the second data compare line 140 to be driven incrementally higher, and the first data line 138 to be driven incrementally lower. The INVOUT signal and DQ0–DQ7 values are at intermediate levels, as the OE signal results in the driver devices within the output drivers (110a–110h) and invert data output driver 122, both being turned off.

At time t1, the CLK signal transitions high once again. Shortly afterward, the DN0–DN7 signals are driven according to an initial value. In the example of FIG. 5, this value is 00000000 (i.e., DN0–DN7 are all low). The OE signal remains low, resulting in the data compare lines (140 and 138), INVN signal, DQ0–DQ7 values, INV signal and INVOUT signals to remain in the state as time t0.

At time t2, the CLK signal transitions low. The resulting CLK_ high signal will couple the DN0–DN7 values (00000000) into their respective data latch circuits (112a–112h). The remaining timing signals and responses are the same as for times t0 and t1.

At time t3 the CLK signal and OE signal transition high. The high OE signal enables the output drivers (110a–110h), invert data output driver 122, invert data latch circuit 126, and the differential amplifier 136. At about the same time a second DN0–DN7 value is applied to the data output system 100. The second data value as shown in FIG. 5 to be 00001111 (i.e., DN0–DN3 are high and DN4–DN7 are low). Because the INVN signal is low, the high CLK signal transition will result in the non-inverted, previously latched DN0–DN7 value (00000000) being coupled the output drivers (110a–110h) within the data output paths (102a–102h). This causes the 00000000 value to be driven on the data output signals DQ0–DQ7.

Also at time t3, the high CLK signal value latches the 00000000 value within the data latch circuits (112a–112h) to generate a latched data value D0–D7 of 00000000. The latched data value 00000000 is compared with the next data value 00001111 within the voter circuit 106. Because exactly half of the latched data values (00000000) are the same as the next values (00001111), the data comparator circuits (132a–132h) will not incrementally change the potential between the first and second data compare lines (138 and 140). However, the low INV signal results in the majority offset circuit 134 maintaining the second data compare line 138 incrementally higher and the first data compare line 138 incrementally lower. With the differential amplifier 136 now enabled, the differential voltage between the compare lines (138 and 140) will be amplified to generate a low INVN signal. In this manner, the data output system 100 compares the current data value (00000000) with the next data value (00001111) and determines that the number of resulting output transitions is not sufficient enough to cause an inversion of the data values. Because the invert data output driver 122 is enabled at time t3, the INVOUT signal will be driven low.

At time t4, the CLK signal transitions high, beginning a fourth clock cycle. At this time the OE signal is still high, maintaining the output drivers (110a–110h), invert data output driver 122, invert data latch circuit 126 and the differential amplifier 136 in the enabled state. The high CLK transitions results in the 00001111 value being latched in the data latch circuits (112a–112h) and driven on the DQ0–DQ7 outputs. Similarly, the previous low INVN signal is latched within the invert data latch 126, and output as the INVOUT signal.

Shortly after time t4, a third next data value DN0–DN7 is applied. The data value is shown in FIG. 5 to be 0001000. This value (00010000) is compared with the latched data value (00001111) in the voter circuit 106. Unlike the previous compare case following time t3, the comparison following time t4 results in five of the data comparator circuits (132a–132e driving the second data compare line 140 incrementally lower, while the remaining three comparator circuits (132f–132h) and the majority offset circuit 134 drive the second compare line 140 incrementally higher. At the same time, the five comparator circuits (132a–132e) drive the first compare line 138 incrementally higher, while three comparator circuits (132f–132h) and the majority offset circuit 134 drive the first compare line 138 incrementally lower. The end result is the second compare line 140 is driven incrementally lower while the first compare line 138 is driven incrementally higher. This differential voltage between the data compare lines (138 and 140) is amplified by the differential amplifier 136 to produce a high INVN signal.

At time t5, as the CLK signal transitions high once again. Unlike the previous cycle, when the CLK signal goes high, the high INVN signal is latched in the invert data latch circuit 126 driving the INV and INVOUT signals high. The high INV value causes the inverse of the 00010000 data value to be latched within the data latch circuits (112a–112h). The inverse value is then driven by the output drivers 110a–110h, resulting in a DQ0–DQ7 value of 11101111.

Shortly after time t5 a fourth next data value of 11100000 is applied. This value is compared with the latched inverse value 11101111. As in the cycle beginning at time t3, because exactly half of the latched data values (11101111) are the same as the next data values (11100000), the data comparator circuits (132a–132h) will not incrementally change the potential between the first and second data compare lines (138 and 140). However, unlike the t3 cycle, the INV signal is high, causing the majority offset circuit 134 to force the first data compare line 138 to be incrementally higher than the second data compare line 140. This differential is further amplified by the differential amplifier 136, resulting in the INVN signal maintaining a high state.

At time t6, the high CLK signal latches the high INVN signal of the previous cycle, to generate high INV and INVOUT signals. The high INV value causes the inverse of the DN0–DN7 value of the previous cycle (00011111) to be latched within the data latch circuits (112a–112h) and driven as the DQ0–DQ7 value.

Shortly after time t6, another next data value is applied. The next data value is 00001111, and so is only one bit different than the latched data value 0001111. As a result, the majority voter circuit 106 drives the second compare line 140 incrementally higher, and the first compare line 138 incrementally lower. The differential amplifier 136 receives the data compare lines (138 and 140) and drives the INVN signal low in response.

At time t7, the high CLK signal latches the low INVN signal of the previous cycle, generating low INV and INVOUT signals. The low INV value causes the DN0–DN7 value of the previous cycle (00001111), in non-inverted form, to be latched within the data latch circuits (112a–112h) and driven as the DQ0–DQ7 value.

Shortly after time t7, a sixth next data value of 11110000 is applied to the data output system 100. This value is compared with the latched data value of 00001111. As shown in FIG. 5, because the next data value (11110000) is logically opposite to the latched data value (00001111), the first compare line 138 is driven substantially higher, and the second compare line 140 is driven substantially lower, and the INVN signal is driven high once again.

Figure 6:
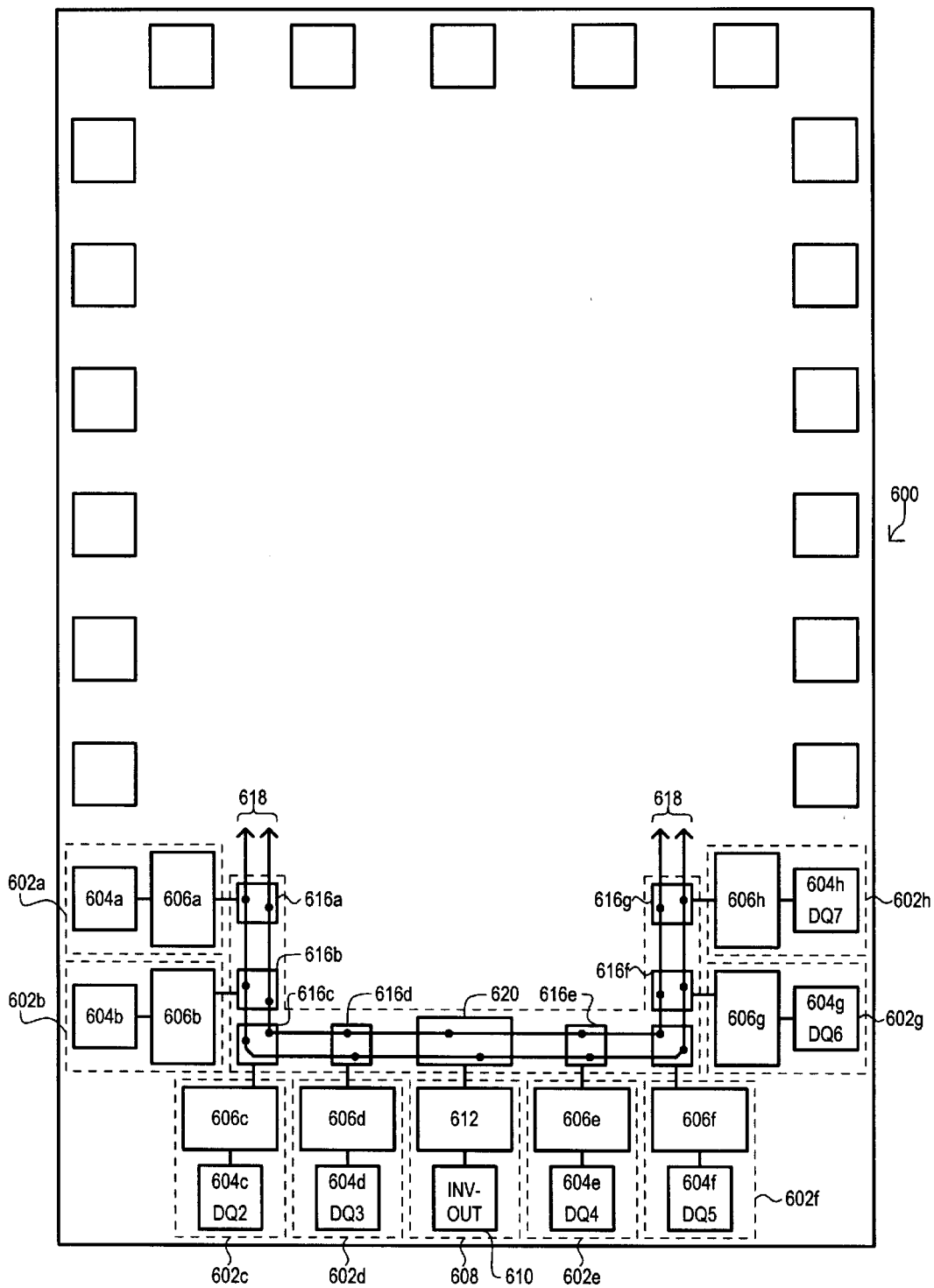
FIG. 6 is a top plan view illustrating the preferred embodiment.

Referring now to FIG. 6, a top plan view of a semiconductor device is set forth to further illustrate the physical arrangement of the preferred embodiment. The semiconductor device is designated by the general reference character 600, and takes the form of a "die" that has been sliced from a semiconductor wafer that has been processed. Set forth on the device are a plurality of data output paths (602a–602h) which may be conceptualized as corresponding to the data output paths (102a–102h) shown in FIG. 1. Within each data output path (602a–602h) is a corresponding data bond pad (604a–604h) and path circuitry (606a–606h). Each path circuitry (606a–606h) can include and output driver and data latch circuit. The semiconductor device 600 further includes an invert data output path 608 formed from an invert data bond pad 610 and invert output path circuitry 612. The invert output path circuitry can include an invert data output driver, invert data latch, and programmable option.

Situated adjacent to the data output paths (602a–602h) is a voter circuit 614. The voter circuit 614 can be conceptualized as corresponding to the voter circuit 106 of FIG. 1. The voter circuit 614 is shown to include a comparator circuit (616a–616h) corresponding to each data output path (612a–612h). Each comparator circuit (616a–616h) is coupled, and situated in the general proximity of its corresponding data output path (612a–612h). In addition, the comparator circuits (616a–616h) are commonly coupled to one another by a pair of compare lines 618. The compare lines 618 can be conceptualized as corresponding to the first and second compare lines (138 and 140) of FIG. 1.

Lastly, the voter circuit 614 is shown to include amplification circuitry 620. The amplification circuitry can include a differential amplifier and a majority offset circuit.

It is further noted that because the devices within the comparator circuits (616a–616h) may have a relatively high "on" resistance, it may be desirable to shield the compare lines 618 from noise. Such noise can be caused by capacitive coupling from other signals, power supplies or substrate noise. One possible way of shielding the compare lines 618 is set forth in FIG. 7.

Figure 7:
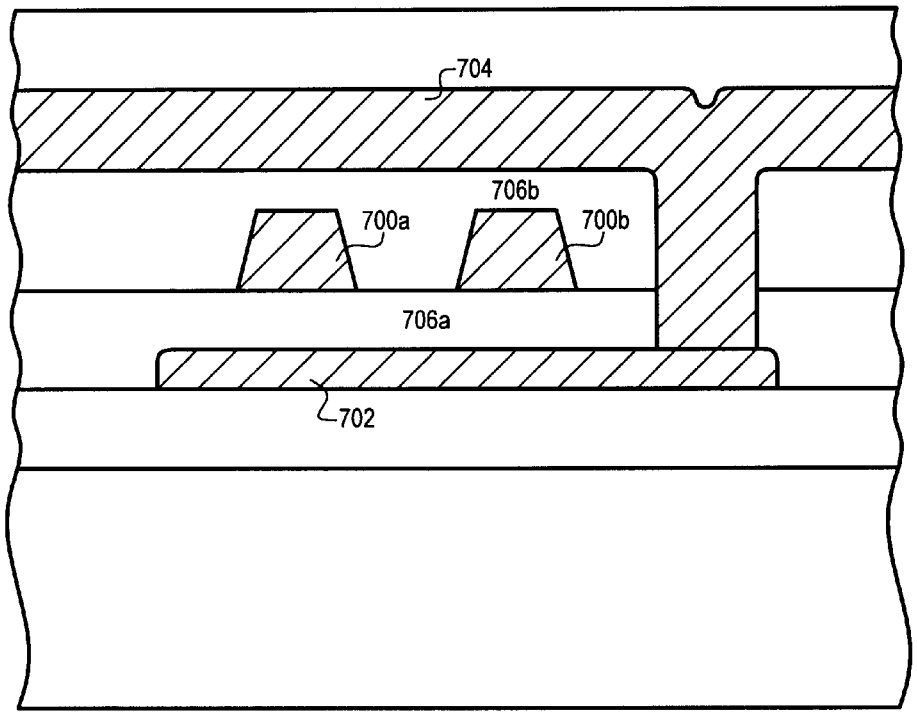
FIG. 7 is a side cross sectional view illustrating a compare line shielding arrangement according to the preferred embodiment.

FIG. 7 is a sides cross sectional view illustrating a shielding arrangement for compare lines (such as 138 and 140 in FIG. 1, 212 and 214 in FIG. 2, or 618 in FIG. 6). Two compare lines are shown as 700a and 700b, and can be formed using a first layer of metal. A first shield layer 702, formed from polysilicon for example, is created underneath the data compare lines (700a and 700b). In addition, a second shield layer 704, formed from a second layer of metal, as just one example, is created over the data compare lines (700a and 700b). The first and second shield layers (702 and 704) are separated from the data compare lines by an insulation layers, shown as 706a and 706b. The insulating layers can be formed from silicon dioxide, as just one example. The first and second shield layers (702 and 704) could then be connected to a "quiet" (low noise) power supply voltage, such as a "quiet" VSS reference, often used in many semiconductor devices.

Figure 8:
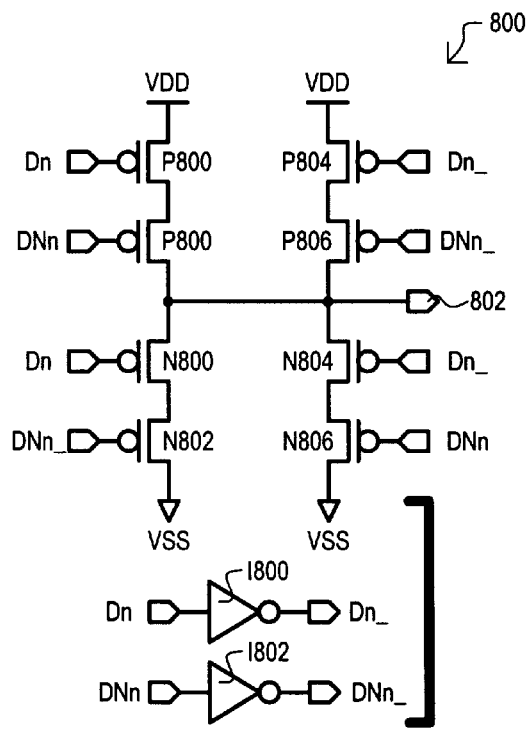
FIG. 8 is a schematic diagram of an exclusive NOR gate that may be used in the preferred embodiment.

Referring now to FIG. 8, a schematic diagram is set forth illustrating a logic gate that may be used as any of the XNOR gates shown as G200a–G200n. The logic gate is a CMOS XNOR gate 800, and is shown to include a first pair of PMOS transistors (P800 and P802) and a second pair of PMOS transistors (P804 an P806). Both pairs of PMOS transistors have source-drain paths arranged in series between the high power supply voltage VDD and an output node 802. In addition, a first pair of NMOS transistors (N800 and N802) and a second pair of NMOS transistors (N804 and N806) each have source-drain paths arranged in series between the output node 802 and the low power supply voltage VSS. The XNOR gate 800 further includes a latched data inverter I800 for receiving a latched data value Dn and providing an inverse latched data value Dn_. A next data inverter I802 receives a next data value DNn and provides an inverse next data value DNn_.

As shown in FIG. 8, PMOS transistor P800 and NMOS transistor N800 both receive the Dn signal. PMOS transistor P804 and NMOS transistor N804 receive the Dn_ signal. The DNn signal is received at the gates of PMOS transistors P802 and NMOS transistor N806. The DNn_ signal is received at the gate of PMOS transistor P806 and NMOS transistor N802.

When the Dn signal and DNn signal are both high, the output node 802 will be coupled to the high power supply voltage VDD by the source-drain paths of PMOS transistors P804 and P806. Similarly, when the Dn and DNn signals are both low, the output node 802 is pulled high by PMOS transistors P800 and P802. However, when the Dn and DNn signals are the same, one device within NMOS transistor pair N800/N802 and N804/N806 will be turned off, isolating the output node 802 from the low power supply voltage VSS. In this manner, a match between the Dn and DNn signals results in a high logic signal at the output node.

Conversely, when the Dn signal and DNn signal are different, one of the NMOS transistor pairs (N800/N802 or N804/N806) will couple the output node to the low power supply voltage VSS. In such a "no match" case, one device within the PMOS transistor pairs P800/P802 and P804/P806 will be turned off, isolating the output node 802 from the high power supply voltage VDD. In this manner, when the Dn and DNn signals do not match, the output node 802 is driven to a low logic value.

Although the present invention has been described in detail, it should be understood that various changes, substitutions, and alterations could be made without departing from the spirit and scope of the invention as defined by the appended claims.

What is claimed is:

1. An output circuit having reduced switching, comprising:

N data output terminals;

an output enable terminal receiving an output enable signal, the output enable signal having an output enable potential and an output disable potential;

N internal data output terminals;

N driver circuits, each coupled to a one of the N data output terminals, one of the N internal data output terminals, and the output enable terminal, each driver circuit receiving an internal data output signal from its respective internal data output terminal and transmitting an output signal to its respective data output terminals when the output enable signal has the output enable potential;

N next data terminals receiving N next data signals;

a voter circuit coupled to the N internal data outputs and the N next data signals, the voter circuit producing a voter output having a first logic level and a second logic level, the voter circuit producing the second logic level when more than half of the N internal data outputs differ in logic level with the N next data signals;

a voter latch circuit coupled to the voter output, the voter latch circuit latching the voter output and producing a voter latch output, the voter latch output having an invert potential and a non-invert potential; and N data switching circuits, each of the N data switching circuits being coupled between a one of the N next data terminals and a one of the N internal data output terminals, the N data switching circuits passing the N next data signals to the N internal data output terminals when the voter latch output is at the non-invert potential and passing inverted N next data signals to the N internal data output terminals when the voter latch output is at the non-invert potential.

2. The output circuit of claim 1, wherein:

the voter circuit receives a voter enable signal having a voter enable potential and a voter disable potential, the voter circuit being disabled when the voter enable signal has the voter disable potential and being enabled when the voter enable signal has the voter enable potential.

3. The output circuit of claim 2, wherein:

the voter circuit further includes a differential amplifier coupled to the voter enable signal, the differential amplifier being disabled when the voter enable signal has the disable potential.

4. The output circuit of claim 2, wherein:

the voter enable signal has the voter disable potential when the output enable signal has the output disable potential.

5. The output circuit of claim 1, wherein:

the voter circuit further includes N data comparators, each data comparator being coupled to a one of the N next data terminals and one of the N internal data output terminals, each data comparator comparing the next data signal received by the next data terminal with the internal data output signal received by the internal data output terminal and producing one of N data comparator outputs.

6. The output circuit of claim 5, wherein:

each data comparator includes an exclusive NOR logic gate.

7. The output circuit of claim 5, wherein:

the exclusive NOR logic gate is a formed from complementary insulated gate field effect transistors.

8. The output circuit of claim 5, wherein:

each of the N data compare outputs has a data compare output signal having a data compare match potential and a data compare mismatch potential; and the voter circuit further includes a data compare line coupled to the N data comparators, the data compare line obtaining a data compare voltage proportional to the number of N data comparator outputs that have the data compare match potential.

9. The output circuit of claim 8, wherein:

the voter circuit further includes majority offset circuit coupled to the data compare line and the voter latch output, the majority offset circuit changing the data compare voltage in response to the voter latch output.

10. A semiconductor device circuit for reducing output transitions, the circuit comprising:

N data output terminals for receiving data output signals, where N is an even integer greater than one;

N next data output terminals for receiving N next data output signals;

N intermediate data output terminals for receiving N intermediate data output signals;

an invert signal having an invert potential and a non-invert potential;

N data switching circuits coupled between the N next data output terminals and the N intermediate data output terminals, the N data switching circuits passing the N next data signals to the N intermediate data output terminals when the invert signal is at the non-invert potential and passing inverted N next data signals to the N intermediate data output terminals when the invert signal is at the invert potential;

a voter circuit coupled to the N next data output terminals, the N intermediate data output terminals, and the invert signal, the voter circuit comparing each of the N intermediate output signals with the corresponding of the N next data output signals and producing a voter output having a first logic potential and a second logic potential in response thereto;

the voter output being at the first logic level when exactly half of the N intermediate output signals have a different logic level from the corresponding half of the N next data output signals and the invert signal has the non-invert potential, and the voter output is at the second logic level when exactly half of the N intermediate output signals have a different logic level from the corresponding half of the N next data output signals and the invert signal has the invert potential.

11. The circuit of claim 10, wherein:

each of the N data switching circuits includes
a switching circuit input that receives one of the N next data signals, a switching circuit output,
an inverting path coupled between the switching circuit input and the switching circuit output, the inverting path inverting the one N next data signal when enabled, the inverting path being enabled when the invert signal is at the invert potential;
a non-inverting path coupled between the switching circuit input and the switching circuit output, the non-inverting path coupling the one N next data signal therebetween when enabled, the non-inverting path being enabled when the invert signal is at the non-invert potential.

12. The circuit of claim 11, wherein:

the inverting path includes an invert transfer gate coupled to the invert signal, and the non-inverting path includes an non-invert transfer gate coupled to the invert signal.

13. The circuit of claim 10, wherein:

the voter circuit includes
at least one compare line,
N compare circuits, each receiving a next data value and the intermediate data output signal from one of the intermediate data output terminals, and driving the compare line toward a first potential when the next data value is equivalent to the intermediate data output, and driving the compare line toward a second potential when the next data value is different than the intermediate data output, and
a majority offset circuit that receives the invert signal, the majority offset circuit driving the compare line toward the first potential when invert signal has the non-invert potential, and driving the compare line toward the second potential when the invert signal has the invert potential.

14. The circuit of claim 9, further including:

an invert data latch coupled to the voter output, the logic levels of the voter output being a next invert data signal for the invert data latch, the invert data latch latching the next invert data signal to provide the invert signal.

15. The circuit of claim 14, wherein:

the semiconductor device operates in synchronism with a periodic clock signal having a first cycle period and a second cycle period; and the invert data latch latches the next invert data signal on one of the clock signal periods.

16. The circuit of claim 10, further including:

the semiconductor device operating in synchronism with a periodic clock signal having a first cycle period and a second cycle period; and each data switching circuit passing next data signals as a switch output when the invert signal is at the non-invert potential, and passing the inverted next data signals as the switch output when the invert signal is at the invert potential; and N data latch circuits, each coupled between one of the switching circuits and its associated intermediate data output terminal, and latching the switch output of its respective data switching circuit on one of the clock signal periods.

17. A semiconductor device having reduced output transitions, comprising:

N data output nodes for receiving data to be output from the semiconductor device;

N internal data output nodes receiving N internal data output signals, each one of the N internal data output nodes being located in the same general physical location on the semiconductor device as the corresponding one of the N data output nodes;

N data output drivers, each one of the N data output drivers being coupled to a one of the N internal data output nodes and a corresponding one of the N data output nodes, each one of the N data output drivers being located in the same general physical location on the semiconductor device as the corresponding one of the N data output nodes;

N next data terminals receiving N next data signals;

a voter circuit for comparing the N next data signals with the N internal data output signals and providing a voter output, the voter circuit including, N data comparators, each data comparator being coupled to a corresponding one of the N next data terminals and a corresponding one of the N internal data output terminals, and being located in the same general physical location as a corresponding one of the N data output drivers, each data comparator comparing the next data signal received by the corresponding one of the N next data terminals with the internal data output signal received by the corresponding one of the N internal data output terminals and generating therefrom one of N data comparator outputs having a data compare match potential and a data compare mismatch potential, a first data compare line coupled to the N data comparators, the first data compare line obtaining a first data compare voltage proportional to the number of N data compare outputs that have the data compare match potential, the first data compare line running generally adjacent to the general physical locations of the N data comparators.

18. The circuit of claim 17, further including:

a second data compare line coupled to the N data comparators, the second data compare line obtaining a second data compare voltage proportional to the number of N data compare outputs that have the data compare mismatch potential, the second data compare line running generally adjacent to the general physical locations of the N data comparators.

19. The circuit of claim 17, further including:

the first data compare line being formed from a first conductive layer; and a first conductive shield layer is formed adjacent to the first data compare line.

20. The circuit of claim 19, wherein:

the first conductive shield layer is formed below the first data compare line and is separated therefrom by an insulation layer.

21. The circuit of claim 20, further including:

a second conductive shield layer formed above the first data compare line and is separated therefrom by a second insulation layer.

22. The circuit of claim 20, wherein:

the first conductive shield layer is formed above the first data compare line and is separated therefrom by a first insulation layer.

\* \* \* \* \*